United States Patent [19]
Chen

[11] Patent Number: 5,952,681
[45] Date of Patent: Sep. 14, 1999

[54] LIGHT EMITTING DIODE EMITTING RED, GREEN AND BLUE LIGHT

[76] Inventor: Hsing Chen, 5F, No. 83, Jen-Ai St., Hsinchu City, Taiwan

[21] Appl. No.: 08/977,654

[22] Filed: Nov. 24, 1997

[51] Int. Cl.$^6$ .................................................. H01L 33/00
[52] U.S. Cl. ................................ 257/89; 257/88; 257/90; 257/98
[58] Field of Search ................................ 257/89, 98, 88, 257/90

[56] References Cited

U.S. PATENT DOCUMENTS

| | | | |
|---|---|---|---|
| 5,650,641 | 7/1997 | Sassa et al. | 257/89 |
| 5,739,552 | 4/1998 | Kimura et al. | 257/89 |

*Primary Examiner*—Minh Loan Tran
*Attorney, Agent, or Firm*—Dougherty & Troxell

[57] ABSTRACT

A multicolor light emitting diode (MLED) is disclosed which can emit various different colored light at the same time. A R, G, B three color LED is formed in a common crystalline granule (chip), with an ultra violet light crystalline granule formed by GaN grown on a sapphire substrate, and the finished products are all transparent. The surrounding of the granule is plated with an insulated layer and then a reflection layer. The light excited by the light granule is emitted either from the front or the back surface of LED. After the excited light has passed through a wave length converting layer, it can be converted to a colored visible light. The entire crystalline granule may be completely formed into an ultra violet or blue light chip, with wave length converting layers so that the chip can emit red, green and blue colors.

13 Claims, 5 Drawing Sheets

LIGHT EMITTING DIODE EMITTING RED, GREEN AND BLUE LIGHT

BACKGROUND OF THE INVENTION

1. Field of the Invention

The present invention relates to the structure of a multicolor light emitting diode (MLED) which can emit various different colored light at the same time.

2. Description of the Prior Art

The most popular multicolor LED in the present market is a three color (red, green, black) LED in which crystals of red, green, and black are packaged altogether. As it was stated in Japan Patent No. 07015044A that it was impossible up to then to produce a R.G.B. three color LED in a single crystalline granule (chip) for the reason that the fundamental materials and production procedures for each color chip were different. The above description has been true up to now. For example, a high luminous red element is formed of three dimensional AlGaAs and four dimensional AlGaInP materials, while blue and green color element are mainly formed of GaN series materials. Since the growth and manufacturing procedures of blue and green epitaxies are not identical so that it is difficult to grow such different epitaxies together simultaneously. In addition, the driving voltage (Vf) for each color is different. It is more difficult to control the intensity of current.

This is the reason why there has no LED with R.G.B three colors formed in a common chip appear in the present market, nor it has been applied to a portable computer display.

SUMMARY OF THE INVENTION

In view of the present situation, the present invention provides a multicolor LED structure which can solve the above described problems, and it can directly form R, G,B three colors in a common chip which can be further cut into single sub-chips to exhibit three colors simultaneously such that the troublesome present technique of employing individual three chips of different color to attain the same object can be thoroughly simplified. This principal is applicable to produce a high resolution display in a portable computer only through a minimum modifications.

The future display employing the principal of the present invention may be imparted several advantages of high luminosity, long life, and no need for back light; further to this, contrast of R,G,B three colors (base on comparison made by the positions on CIE colorimetry coordinate) is also superior to UCD and CRT. Therefore, outlook of the device according to the present invention can be equally ranked with TFTLCD, FED or PDP displays.

The principal of multicolor LED of the present invention is identical as that of fluorescent lamps, wherein R,G,B three color fluorescent powder coated on the light emission element is excited by ultra violet ray for the purpose of emitting white light or other various colored lights. The white light produced in such way contains R,G,B three wave lengths which can be employed by color display screen or smaller size display, or even used as a back light source. Moreover, use of ultra violet light for excitation is more convenient and inexpensive than blue light.

Recently, trend of study on short wave light emitting and laser diode has been progressive, and more particularly, the study on AlGaInN series materials based on 3,5-family nitride compound semi-conductor due to the fact that nitride has highest bandgap among 3,5-family semiconductor, and by varying its composition a high efficiency light emitting element with the wave length within the range of yellow light and ultra violet light is obtainable. At present, research organization, as Nichia chemical Japan, successively accomplished blue light, green light and other high luminous intensity LEDs with the wave lengths 450 and 525 nm, wherein the structure of LED and single quantum well employed may achieve a high quantum effect so that a resembling structure (as shown in FIG. 1 of the present invention) may be employed in order to produce an ultra violet ray LED, wherein the structure of quantum well in the active layer is GaN. By regulating thickness of quantum well to about 20~100 Å, a high efficiency LED (near ultra violet light) is obtainable. Since the lattice constants of GaN active layer 5 and AIGaN confining layer are almost matching, so the quality of the GaN active layer 5 is high without any defect. On the other hand, the active layer 5 of Nichia's blue LED is formed by GaInN in which containing 20% of In, and its quantum efficiency is about 7%, while for the ultra violet ray LED of the present invention, its theoretical value of quantum efficiency may reach so high as to 10% and above.

Moreover, during manufacturing procedure, no additive is applied to the active layer of the ultra violet ray LED, it is easier to manufacture than blue or green light LED with better yield rate.

In manufacturing above described LED, 3,5-family nitride may be grown on a sapphire substrate by means of metal or vapor phase epitaxy. Since the sapphire substrate is an insulating material, so when manufacturing crystalline granule, the eitching process must begin from InN epitaxy layer until exposing P type GaN, and then again proceed to forming process and electrode evaporation plating, at last the material is cut into 350×350 $\mu$m chips and the manufacturing of ultra violet ray LED is accomplished as shown in FIG. 1.

The wave length converting layer of the present invention is mainly formed by coating wave length convertible fluorescent power added with transparent resin. As for the fluorescent powder, it shall be excited by near ultra violet light (350~380 nm). A comparatively stable oxide fluorescent powder is employed in the present invention such as YVO4, Eu series or Y2O2S, with wave length about 620 nm for red color; Ba Mg A14O23; Eu series with wave length about 454 nm for blue color;and ZnO; Zn series with wave length about 505 nm for green color. However, there are still many usable fluorescent powder such as ZnS series, among those the oxide powder is stablest, its withstanding temperature may reach 200° C. and does not fade for long serving so as to allow the LED to maintain its light emitable time longer than 50,000 hours. This is the reason why the oxide powder is preferred in the present invention.

To obtain a LED having red, green, blue three different color light spectrums, it is only necessary to coat red, green and blue three color fluorescent powder on an ultra violet light chip with light wave length about 350~385 nm near the ultra violet light that will never hurt the human body or damage any object. It should be understood the general ultra violet ray emitted by commercial fluorescent lamps may hurt the human body if subjected for long time.

BRIEF DESCRIPTION OF THE DRAWINGS

The invention, as well as its many advantages, may be further described by the following detailed description and drawings in which.

Figure 1:
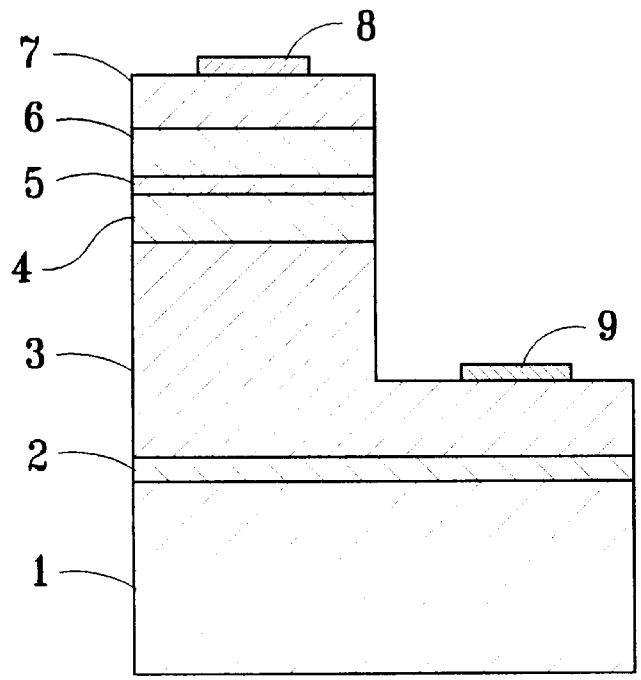
FIG. 1 is a cross sectional view of an ultra violet light LED of the present invention.

[Reference Numerals for Parts:]
1: sapphire substrate
2: GaN buffer layer
3: N type GaN contact layer
4: N type AlGaN confining layer
5: Ti GaN active layer
6: P type AlGaN confining layer
7: P type GaN
8: P type electrode
81: P type transparent electrode
9: N type electrode
10: bottom surface reflection layer
11: insulation layer
12: reflection layer
13: wave length converting layer
14: insulated reflection layer
15: light filtering layer
20: transparent sealing gel
R: red light G: green light B: blue light

DETAILED DESCRIPTION OF THE PREFERRED EMBODIMENT

As shown in FIG. 1, a crossectional view of the present invention, wherein ultra violet light is emitted by applying a potential of about 3.5 V on P type electrode 8 and N type electrode 9. In the structure of FIG. 1, light emitting center is at TiGaN active layer 5. As the substrate is a sapphire substrate 1 of aluminum oxide mono crystalline, it is transparent as a piece of glass, and the various epitaxies grown on it are transparent in addition to electrodes. For this reason, it may emit light in all directions. In order to facilitate the ultra violet light can concentrically emit from the back surface, a reflection layer 12 shown in FIG. 2 shall be provided to surround the chip.

Figure 2:
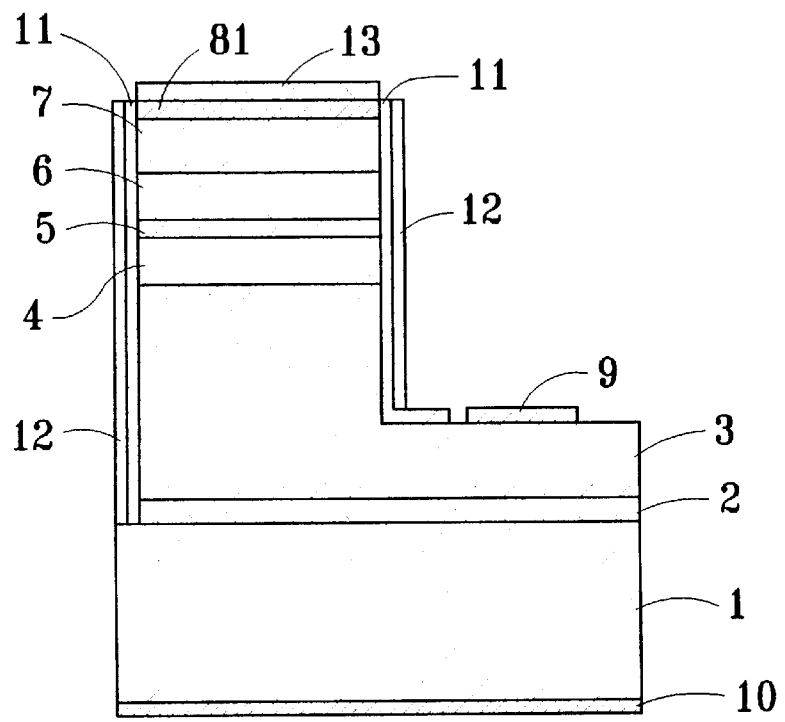
FIG. 2 is a single structural view of a multicolor LED of the present invention (front light emitting type)

As shown in FIG. 2, the excited light is emitted from the front so that a bottom surface reflection layer 10 must be provided at the bottom surface of the substrate 1, and also plate a layer of insulation layer 11 around the chip and again plate a reflection layer 12 on the insulation layer 11. After such treatment, the ultra violet light may emit from the front surface, and through function of transparent electrode 81 and the wave length converting layer 13, a visible light LED of any color can be produced. The p type electrode 8 is formed by a transparent conductive p type electrode 81 whereon a wave length converting layer 13 is coated or plated. The layer 13 contains a fluorescent material which can absorb ultra violet light and convert it to visible light. The fluorescent material of any color is applicable only it can be excited by the light of wave length between 360 nm and 385 nm emitted by the ultra violet light chip of the present invention, and capable of emitting R,G,B three color visible light.

Figure 3:
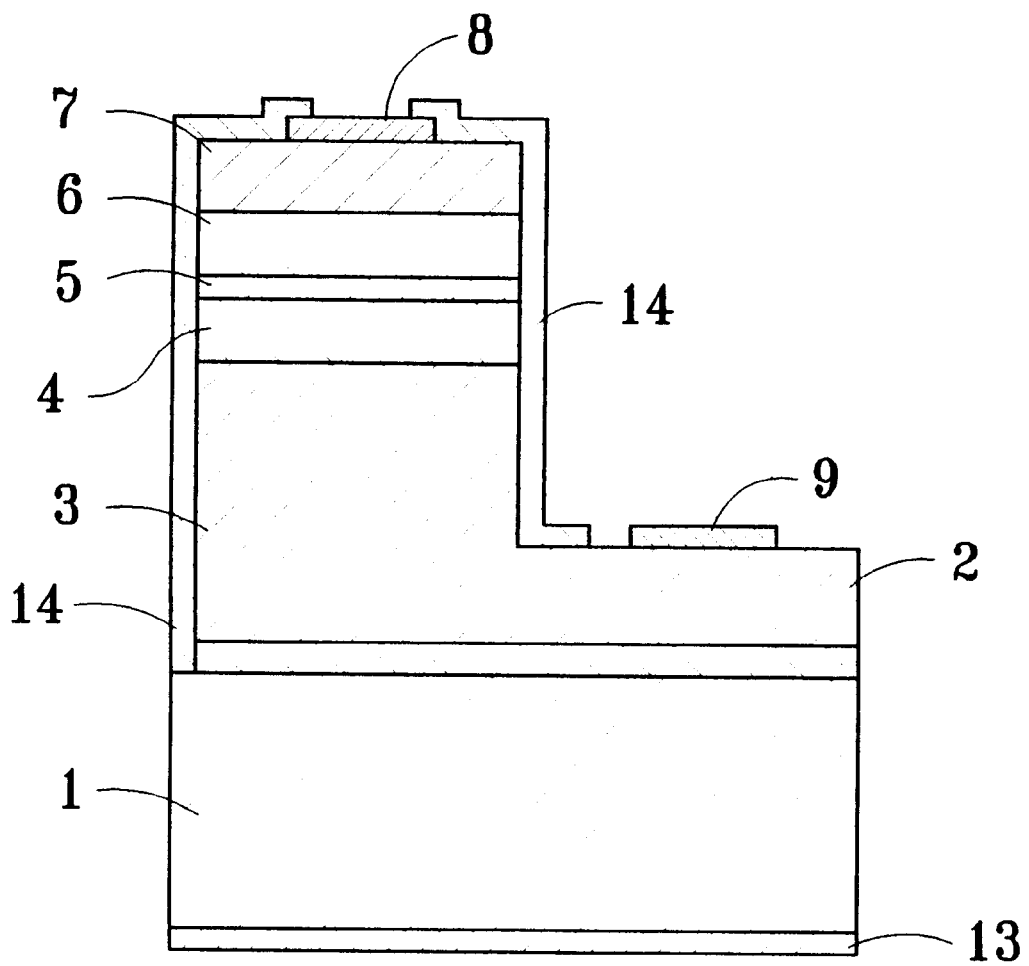
FIG. 3 is a single structural view of a multicolor LED of the present invention (back light emitting type)

As shown in FIG. 3, wherein the direction of light is from back surface, such a design mode has never been tried by any other case because the material for manufacturing color LED, for example, arsenide as AsGa crystalline is a non-transparent material so that it can not emit light out of the back surface. It is only materials of GaN series that have such behavior. Thus, a wave length converting layer 13 is covered on the transparent light emitting surface of the supphire substrate 1, and in addition, an insulated reflection layer 14 is plated around the surroundings of the chip, or alternatively, plate an insulation layer 11 and then plate a reflection layer 12 thereon. The electrodes in this embodiment are formed by light reflective materials as gold, alminum and silver which can exhibit dual function of light reflection and electrode. By such structure the object of emitting light from back surface is achieved and manufacturing procedures of multi-element chip surface is beneficially provided, for example, IC boards manufacturing procedures for display devices.

Figure 4:
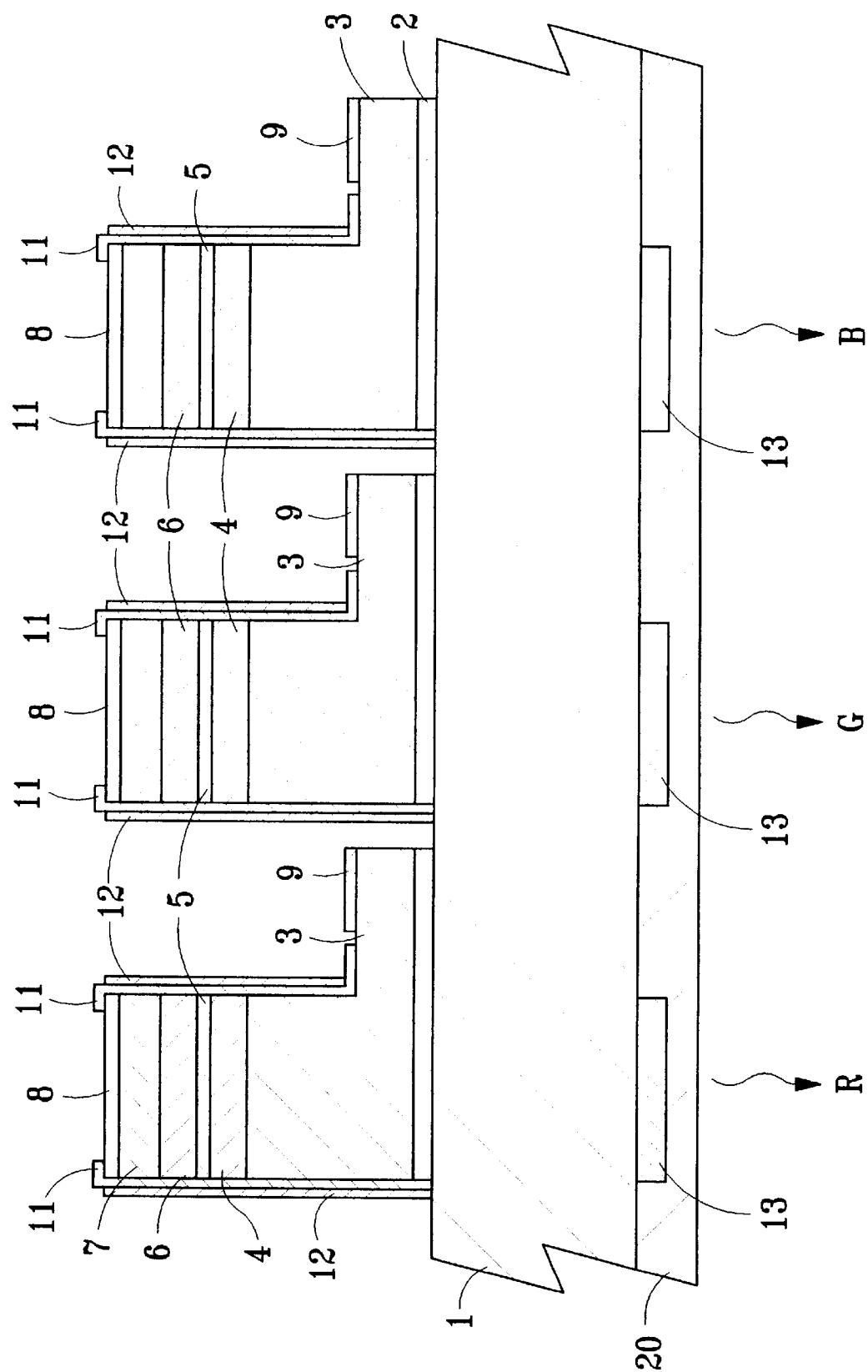
FIG. 4 is a first embodiment of back light emitting type LED of the present invention.

As shown in FIG. 4, the view of a first embodiment of the present invention, wherein the structure mainly comprises three ultra violet light LEDs associated with a R,G,B three color wave length converting layer to form a three primary color LED, in other words, a basic structure of a multi-color LED of the present invention is composed of three basic structures shown in FIG. 3. In addition to its excited light is emitted from the back surface, the surface of its wave length converting layer 13 is coated with a layer of transparent sealing gel 20 to protect the wave length converting layer 13 there beneath. The P type electrode 8 is made of light reflective material, and an insulation layer 11 covers the surroundings of the chip, at last a reflection layer 12 is added to complete the forming of the structure of high luminosity, high efficiency LED capable of emitting excited light concentrically from its back surface.

Figure 5:
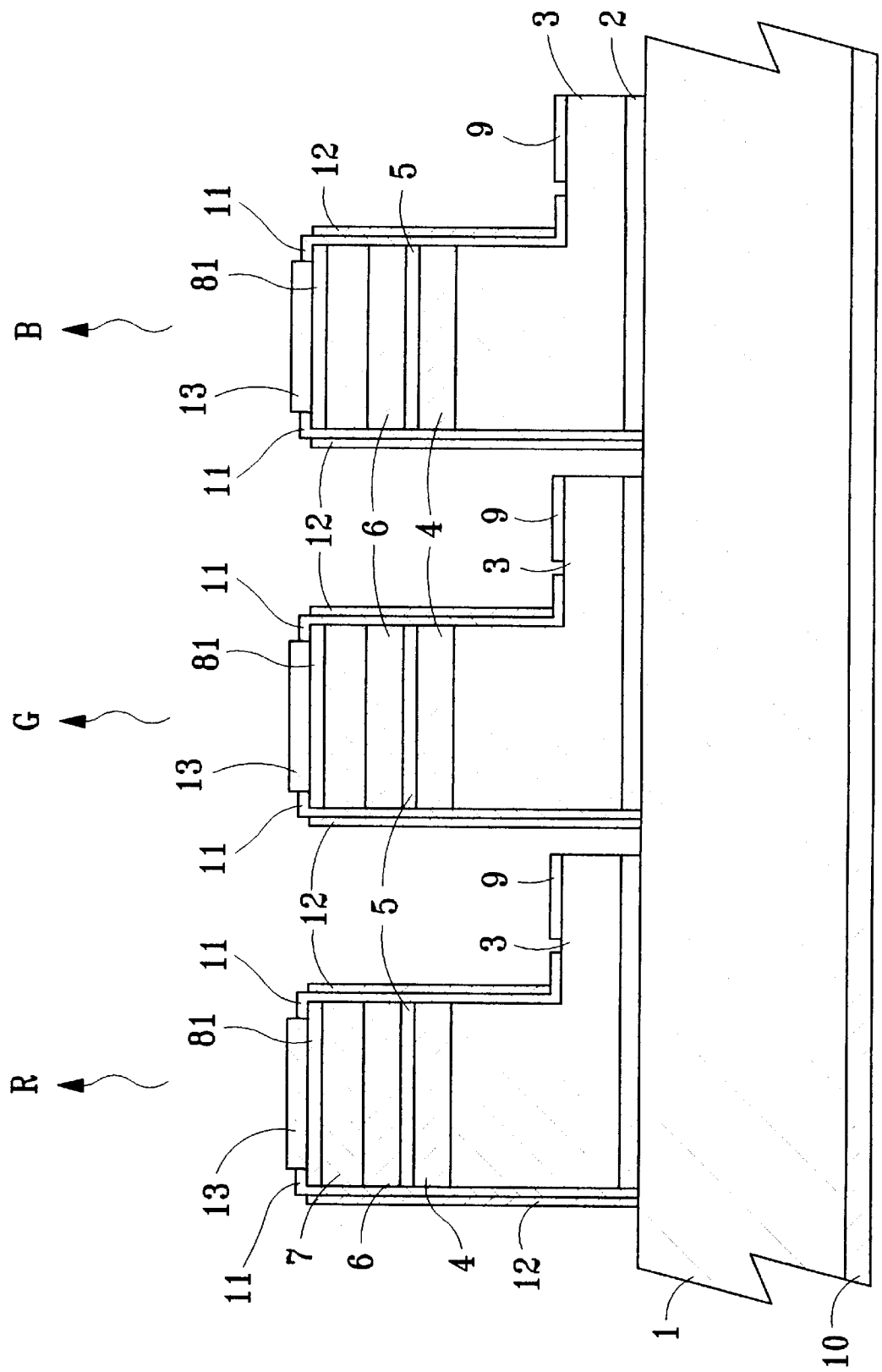
FIG. 5 is a second embodiment of front light emitting type LED of the present invention.

As shown in FIG. 5, the view of a second embodiment of the present invention, wherein the excited R,G,B three color light emits out of the front surface. At first, a reflection layer is plated on the back surface of a sapphire substrate, and the electrode is a P type transparent electrode 81. Similar to the former embodiment, an insulation layer 11 is plated around the surroundings of the ultra violet light chip, finally, a reflection layer 12 is plate thereon so that the excited R,G,B three color light may concentrically emit out of the front surface.

The above described structures are all using ultra violet light crystalline granule for their basic material, and a reflection layer 12 is applied to the front and back surfaces of the chip surroundings, and at last a wave length converting layer 13 is plated on the ultra violet light emitting surface to assure that the LED can emit various colored light.

Figure 6:
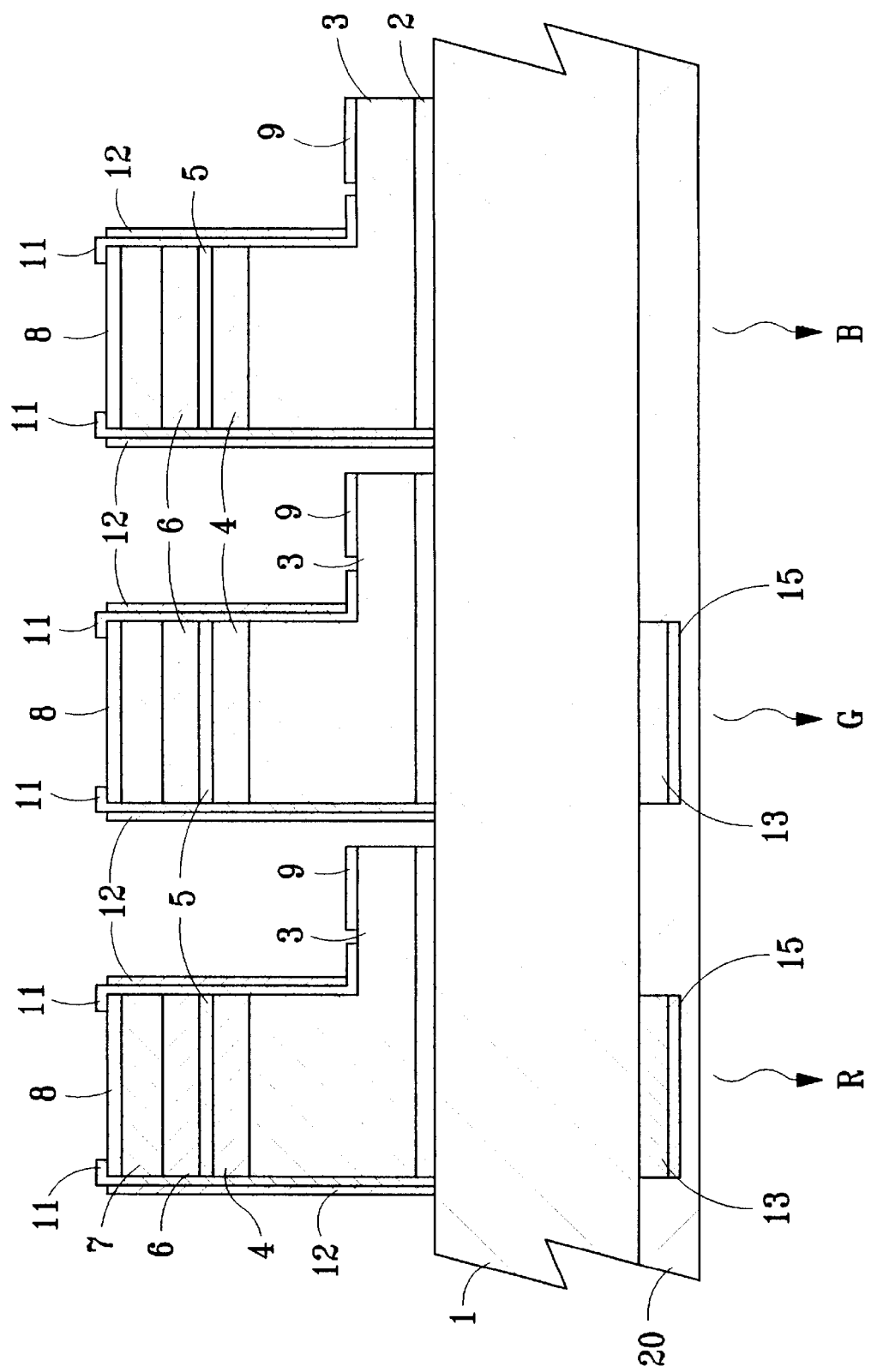
FIG. 6 is a blue color LED chip used in a third embodiment of the present invention.

Alternatively, it is allowable to use blue light crystalline granule to replace ultra violet light one and still it is able to emit R,G,B three color light. As is shown in FIG. 6, a third embodiment of the present invention, wherein three light emitting chips are all belong to blue light with back surface emitting mode, in other words, around the surroundings of three pieces of blue light chips, at first an insulation layer 11 is plated, and then followed by reflection layer 12. Besides, a bottom surface reflection layer 10 is plated on the bottom surface of the substrate. The P type electrode 8 is formed by light reflective matallic layer, and a red and green color wave length converting layer 13 is plated respectively on two out of the three chip bottom surfaces facing the substrate 1 to form blue-red light and blue-green light respectively. Again, in order to filter away blue light, a blue light filter layer 15 is coated respectively on each red and green wave length converting layer 13 for obtaining red and green lights as the last result. By above described structure, in addition to the light excited by a blue light chip may be emitted out of the back surface of the LED, the structure may also be utilized as a colored unit. But speaking of the efficiency, an ultra violet light crystalline is far superior to a blue light one after all.

Many changes and modifications in the above described embodiment of the invention can, of course, be carried out without departing from the scope thereof. Accordingly, to promote the progress in science and the useful arts, the invention is disclosed and is intended to be limited only by the appended claims.

What is claimed is:

1. A multicolor LED comprising:
   a) at least three light emitting diode chips on a transparent substrate, each light emitting diode chip having:
      a P type electrode;
      a N type electrode;
      a reflection layer to direct light produced by the light emitting diode chip in a predetermined light emitting direction; and,
   b) at least two wavelength converting layers located in the predetermined light emitting direction of the light from at least two of the light emitting diode chips, whereby light having at least three different colors is emitted from the LED.

2. The multicolor LED as claimed in claim 1, wherein said light emitting diode chips comprise three blue light LED chips on said substrate to form one colored unit wherein said at least two wavelength converting layers are associated with two of the three blue light LED chips enabling the colored unit to emit red, green and blue light.

3. The multicolor LED as claimed in claim 2, wherein the predetermined light emitting direction is through back surfaces of the blue light LED chips wherein each of said three blue light LED chips further comprise an insulation layer on which is formed said reflection layer; each of said P type electrodes comprises a reflective metallic layer; and wherein said at least two wavelength converting layers comprise red and green wavelength converting layers on a bottom surface facing the substrate to emit red, green and blue light respectively.

4. The multicolor LED as claimed in claim 3, wherein each of said three blue light LED chips comprise an insulating layer on which is formed said reflection layer, wherein said P type electrode comprises a reflective metallic layer, said wavelength converting layers located on bottom surfaces of two of said three blue light LED chips and comprising red and green wavelength converting layers respectively to emit blue-red and blue-green colored light respectively, and further comprising a blue light filter layer on each of said red and said green wavelength converting layers for obtaining red and green lights respectively, in addition to the blue light excited by said blue light LED chip being emitted out of a back surface of said LED.

5. The multicolor LED as claimed in claim 4, further comprising a transparent sealing gel coated on a surface of said wavelength converting layer to protect said wavelength converting layer.

6. The multicolor LED as claimed in claim 2, wherein said three blue light LED chips have the predetermined light emitting direction through front surfaces each of said three blue light LED chips further comprising an insulation layer on which is formed said reflection layer; a second reflection layer formed on a bottom surface of the substrate; said P type electrode comprising a transparent electrode, said at least two wavelength converting layers located on two of said three blue light LED chips P type electrodes, and comprising red and green wavelength converting layers respectively to emit blue-red light and blue-green light respectively, and further comprising a blue light filter layer formed on each of said red and said green wavelength converting layer to filter out blue light, thereby obtaining red and green lights, in addition to the blue light excited by said blue light LED chip.

7. The multicolor LED as claimed in claim 1, wherein said light emitting diode chips comprise three ultra violet light emitting diode chips and further comprising a wavelength converting layer located in the predetermined light emitting direction of the light from the three ultra violet light emitting diode chips.

8. The multicolor LED as claimed in claim 7, wherein said reflection layer is comprised of a material having both reflective and insulative properties.

9. The multicolor LED as claimed in claim 7, wherein the predetermined light emitting direction is through front surfaces of the ultra violet light emitting diode chips, wherein said ultra violet light emitting diode chips each further comprise an insulation layer with said reflection layer being formed thereon; a second reflection layer formed on a bottom surface of the substrate; and wherein said P type electrode comprises a transparent electrode with said wavelength converting layer coated thereon whereby three colors of light are emitted out of said LED.

10. The multicolor LED as claimed in claim 7, wherein the wavelength converting layers comprise red, green, and blue wavelength converting layers one wavelength converting layer formed on each of said three ultra violet light emitting diode chips to enable the LED to emit red, green and blue light.

11. The multicolor LED as claimed in claim 10, wherein the predetermined light emitting direction is through front surfaces of the ultra violet light emitting diode chips, wherein each of said three ultra violet light emitting diode chips further comprise an insulation layer with said reflection layer formed thereon; a second reflection layer formed on a bottom surface of the substrates; said P type electrode comprises a transparent electrode; and said wavelength converting layers comprise red, green and blue wavelength converting layers for emitting red, green and blue light respectively.

12. The multicolor LED as claimed in claim 10, wherein the predetermined light emitting direction is through back surfaces of the ultra violet light emitting diode chips, wherein each of said three ultra violet light emitting diode chips further comprise an insulation layer with said reflection layer formed thereon; and wherein said P type electrode comprises a reflective metallic layer, said wavelength converting layers comprising red, green and blue wavelength converting layers on a bottom surface facing said substrate to emit red, green and blue light respectively.

13. The multicolor LED as claimed in claim 12, further comprising a transparent sealing gel coated on a surface of each of said wavelength converting layers to protect said wavelength converting layers.

* * * * *